(12) United States Patent
Numajiri (10) Patent No.: US 8,334,613 B2
(45) Date of Patent: Dec. 18, 2012

(54) WIND TURBINE GENERATOR AND ASSEMBLING METHOD THEREOF

(75) Inventor: Tomohiro Numajiri, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 63 days.

(21) Appl. No.: 12/674,490

(22) PCT Filed: Aug. 3, 2009

(86) PCT No.: PCT/JP2009/063767
§ 371 (c)(1),
(2), (4) Date: Apr. 22, 2010

(87) PCT Pub. No.: WO2011/016108
PCT Pub. Date: Feb. 10, 2011

(65) Prior Publication Data
US 2011/0204647 A1    Aug. 25, 2011

(51) Int. Cl.
*F03D 11/00* (2006.01)
(52) U.S. Cl. .............................. 290/55; 403/11
(58) Field of Classification Search .......... 290/55; 403/15
See application file for complete search history.

(56) References Cited

U.S. PATENT DOCUMENTS

| | | | |
|---|---|---|---|
| 4,425,050 A * | 1/1984 | Durand | 403/15 |
| 4,525,916 A | 7/1985 | Wuhrer | |
| 4,616,948 A * | 10/1986 | Jelfs | 403/5 |
| 5,149,220 A | 9/1992 | Elsner et al. | |
| 6,911,741 B2 * | 6/2005 | Pettersen et al. | 290/44 |
| 7,179,056 B2 * | 2/2007 | Siegfriedsen | 416/170 R |
| 7,642,668 B2 * | 1/2010 | Kim et al. | 290/55 |
| 2008/0272602 A1 | 11/2008 | Kim et al. | |
| 2009/0324323 A1 * | 12/2009 | Yamashita et al. | 403/16 |

FOREIGN PATENT DOCUMENTS

| | | | |
|---|---|---|---|
| DE | 19938436 C1 * | 4/2001 | |
| EP | 2014917 A1 * | 1/2009 | |
| JP | 2001-304094 A | 10/2001 | |
| JP | 2006-46107 A | 2/2006 | |
| JP | 2007-198167 A | 8/2007 | |
| JP | 2008025596 A | 2/2008 | |
| KR | 1020060060046 A | 2/2006 | |
| WO | 2007/111425 A1 | 10/2007 | |
| WO | 2007111425 A1 | 10/2007 | |

OTHER PUBLICATIONS

Office Action for Australian application 2009342698, mailed May 31, 2011.
Korean Notice of Allowance for 2010-7021914 dated Apr. 24, 2012.
Canadian Office Action dated May 28, 2012.
Notice of Acceptance in corresponding Australian Application No. 2009342698.

* cited by examiner

*Primary Examiner* — Joseph Waks
(74) *Attorney, Agent, or Firm* — Kanesaka, Berner & Partners

(57) ABSTRACT

A wind turbine generator includes: a main shaft for supporting a wind turbine rotor; a main bearing for rotatably supporting the main shaft; a generator having a generator rotor and a stator; a sleeve connected to the generator rotor and inserted onto the main shaft; and a hydraulic shrink fit provided outside the sleeve and tightening the sleeve to connect to the main shaft. The hydraulic shrink fit is constructed to reduce the inner diameter through a supply of hydraulic fluid to secure the sleeve to the main shaft.

9 Claims, 13 Drawing Sheets

WIND TURBINE GENERATOR AND ASSEMBLING METHOD THEREOF

RELATED APPLICATIONS

The present application is based on, and claims priority from, International Application Number PCT/JP2009/063767, filed Aug. 3, 2009, the disclosure of which is hereby incorporated by reference herein in its entirety.

TECHNICAL FIELD

The present invention relates to a wind turbine generator and assembling method thereof, especially concerns about the connection structure between a main shaft and a generator rotor in a wind turbine generator.

BACKGROUND ART

In designing of the wind turbine generator, optimization of the connection structure between a main shaft and a generator rotor is one of important design particulars. The main shaft and the generator rotor have to be connected with a necessary strength. Meanwhile, it is desired for the main shaft and the generator rotor to be connected each other so as to allow relative movement in case of an excessive torque application between the main shaft and the generator rotor, for example, in case of a short-circuit in the generator.

One of commonly-known structures as a connection structure between the main shaft and the generator rotor is a scheme in which the rotor plate of the generator rotor is connected to a cylindrical sleeve and the cylindrical sleeve is tightening by a shrink-fit (a shrink disk). The structure is preferable in that the connection strength between the main shaft and the generator rotor can be easily adjusted and additionally the cost can be reduced, since the generator rotor can be connected to the main shaft by a generally-available shrink-fit.

The structure for connecting the main shaft and the generator rotor by using a sleeve and a shrink fit is described, for example, in International Publication Pamphlet WO2007/111425 A1 (Patent Document 1). Patent Document 1 discloses a connection structure for tightening a rotor bearing (corresponding to a sleeve of the present invention) to which the generator rotor is connected to the main shaft by a shrink disk (corresponding to a shrink fit of the present invention). In the connection structure, the shrink disk is placed between the power generator and a bearing, and tightens the rotor bearing to the main shaft at that position. The shrink disk is composed of a fixed disk and a movable disk, and the fixed disk and the movable disk are connected with each other by a bolt. The bolt is inserted in parallel with the central axis of the main shaft. When the bolt is tightened, the movable disk is pressed to the fixed disk to narrow the internal diameter of the shrink disk and accordingly the rotor bearing is tightened to the main shaft.

One problem of such connection structure is an increase of the clearance between the bearing supporting the main shaft and the power generator. As described above, the connection structure of Patent Document 1 requires securing a work space used for tightening the bolt between the power generator and the bearing, since the shrink disk is positioned between the power generator and the bearing and the bolt is inserted in a direction parallel to the main shaft. This increases the clearance between the power generator and the bearing. The increase in the clearance between the power generator and the bearing increases bowing of the main shaft, enhancing vibrations. This is not preferable because the mechanical load is increased. The increase of the clearance between the power generator and the bearing is a problem in that the length of the main shaft is increased. The increase in the length of the main shaft also increases the cost of the main shaft.

The problem of the increase in the clearance between the power generator and the bearing is serious especially in a direct-drive wind turbine generator. In the direct-drive wind turbine generator, which does not use a speed-up gear, the stator pole number and the rotor pole number are required to increase, and accordingly the weight of the power generator tends to increase. In this case, when the distance between the bearing and the power generator is increased, this may further increase the vibration, due to the further increase in the bowing of the main shaft.

CITATION LIST

Patent Literature

Patent Document 1: International Publication Pamphlet WO2007/111425 A1

SUMMARY OF THE INVENTION

Accordingly, an object of the present invention is to provide a connection structure between a main shaft and a generator rotor, which allows shortening the clearance between a bearing supporting the main shaft and the power generator.

In one aspect of the present invention, a wind turbine generator includes: a main shaft for supporting a wind turbine rotor; a main bearing for rotatably supporting the main shaft; a generator having a generator rotor and a stator; a sleeve connected to the generator rotor and inserted onto the main shaft; and a hydraulic shrink fit provided outside the sleeve and tightening the sleeve to connect to the main shaft. The hydraulic shrink fit is constructed to reduce the inner diameter through a supply of hydraulic fluid to secure the sleeve to the main shaft.

The hydraulic shrink fit may be provided at various positions. It is desirable that the hydraulic shrink fit is provided in an inside space of the generator.

For example, when the stator includes: stator magnetic poles arranged in the circumferential direction of the main shaft; and first and second stator plates for supporting the stator magnetic poles, the stator plates being arranged in the axial direction of the main shaft, and the first stator plate and the main shaft are rotatable to each other via a first generator bearing, the second stator plate and the main shaft are rotatable to each other via a second generator bearing, and the generator rotor includes: rotor magnetic poles arranged in the circumferential direction of the main shaft; and a rotor supporting member for supporting the rotor magnetic poles, the rotor supporting member being arranged between the first stator plate and the second stator plate, the hydraulic shrink fit may be provided between the rotor supporting member and the first stator plate.

In this case, it is preferable that an opening for supplying the hydraulic fluid to the hydraulic shrink fit is provided through the first stator plate at the position corresponding to the hydraulic shrink fit. In this case, it is preferable that a procedure for tightening the hydraulic shrink fit includes: a step of inserting a temporary protection tube into the opening provided through the first stator plate so that a port of the hydraulic shrink fit is positioned inside the temporary protection tube; and a step of connecting a hydraulic pressure pipe to the port inside the temporary protection tube; and a step of supplying the hydraulic fluid to the hydraulic shrink fit via the hydraulic pressure pipe to tighten the sleeve to the main shaft by the hydraulic shrink fit.

It is also preferable that a slit is provided for an abutting portion of the sleeve, the abutting portion abutting on the hydraulic shrink fit.

It is also preferable that the sleeve is divided at a position abutting on the hydraulic shrink fit, instead. Specifically, it is preferable that the sleeve includes first and second sleeve members arranged in the axial direction of the main shaft, a plurality of first protuberance portions arranged in the circumferential direction of the main shaft and protuberating in the axial direction of the main shaft are provided at an end of the first sleeve member; a plurality of second protuberance portions arranged in the circumferential direction of the main shaft and protuberating in the axial direction of the main shaft are provided to an end of the second sleeve member, and each of the plurality of first protuberance portions is inserted between two of the plurality of second protuberance portions. In this case, the hydraulic shrink fit is provided so as to abut the first protuberance portions and the second protuberance portions.

In another aspect of the present invention, a wind turbine generator is provided with a main shaft for supporting a wind turbine rotor; a main bearing for rotatably supporting the main shaft; a generator having a generator rotor and a stator; a sleeve connected to the generator rotor and inserted onto the main shaft; and a hydraulic shrink fit provided between the sleeve and the main shaft. The hydraulic shrink fit is configured so as to connect the sleeve to the main shaft by increasing an outer diameter thereof through a supply of hydraulic fluid.

In this wind turbine generator, the stator may include stator magnetic poles arranged in the circumferential direction of the main shaft; and first and second stator plates for supporting the stator magnetic poles, the stator plates being arranged in the axial direction of the main shaft, the first stator plate and the main shaft may be rotatable to each other via a first generator bearing, and the second stator plate and the main shaft may be rotatable to each other via a second generator bearing. In this case, it is preferable the hydraulic shrink fit is provided at such a position that the hydraulic shrink fit is not opposed to the first and second generator bearings in the radius direction of the main shaft.

It is preferable that a portion of the sleeve between positions where the first and second generator bearings and a position abutting on the hydraulic shrink fit is configured so as to absorb distortion caused by tightening of the hydraulic shrink fit.

The present invention provides a connection structure between the main shaft and the generator rotor, which allows reducing the clearance between the bearing supporting the main shaft and the generator.

DESCRIPTION OF EMBODIMENTS

First Embodiment

Figure 1:
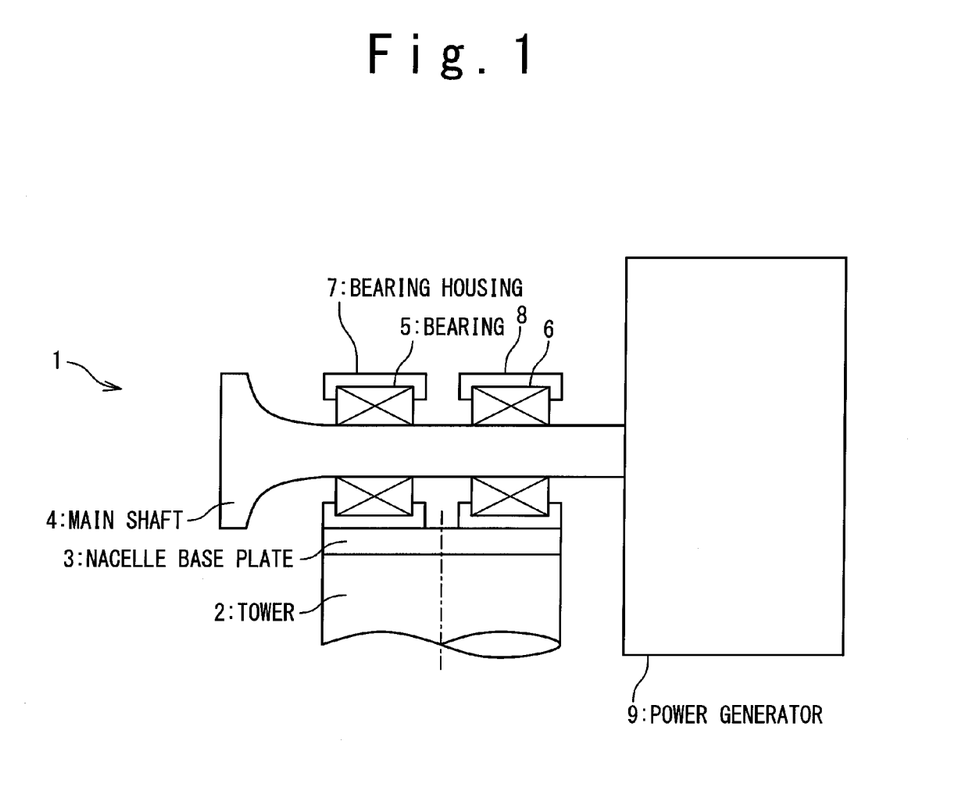
FIG. 1 is a schematic diagram schematically showing a configuration of a wind turbine generator in one embodiment of the present invention.

FIG. 1 is a conceptual view schematically showing a wind turbine generator 1 in a first embodiment of the present invention. The wind turbine generator 1 of this embodiment includes a tower 2, a nacelle base plate 3, a main shaft 4, bearings 5 and 6, bearing housings 7 and 8, and a power generator 9. The nacelle base plate 3 is placed on the top of the tower 2 so as to allow yaw-rotation. The main shaft 4 is rotatably supported by the two bearings 5 and 6, and the bearings 5 and 6 are secured on the nacelle base plate 3 by the bearing housings 7 and 8. A wind turbine rotor (not shown in the drawing) is connected to one end of the main shaft 4, and the rotor of the power generator 9 is connected to the other end. In the wind turbine generator 1 of this embodiment, the main shaft 4 is shared by the wind turbine rotor and the generator rotor, and the wind turbine generator 1 of this embodiment is configured as so-called direct drive wind turbine generator.

Figure 2A:
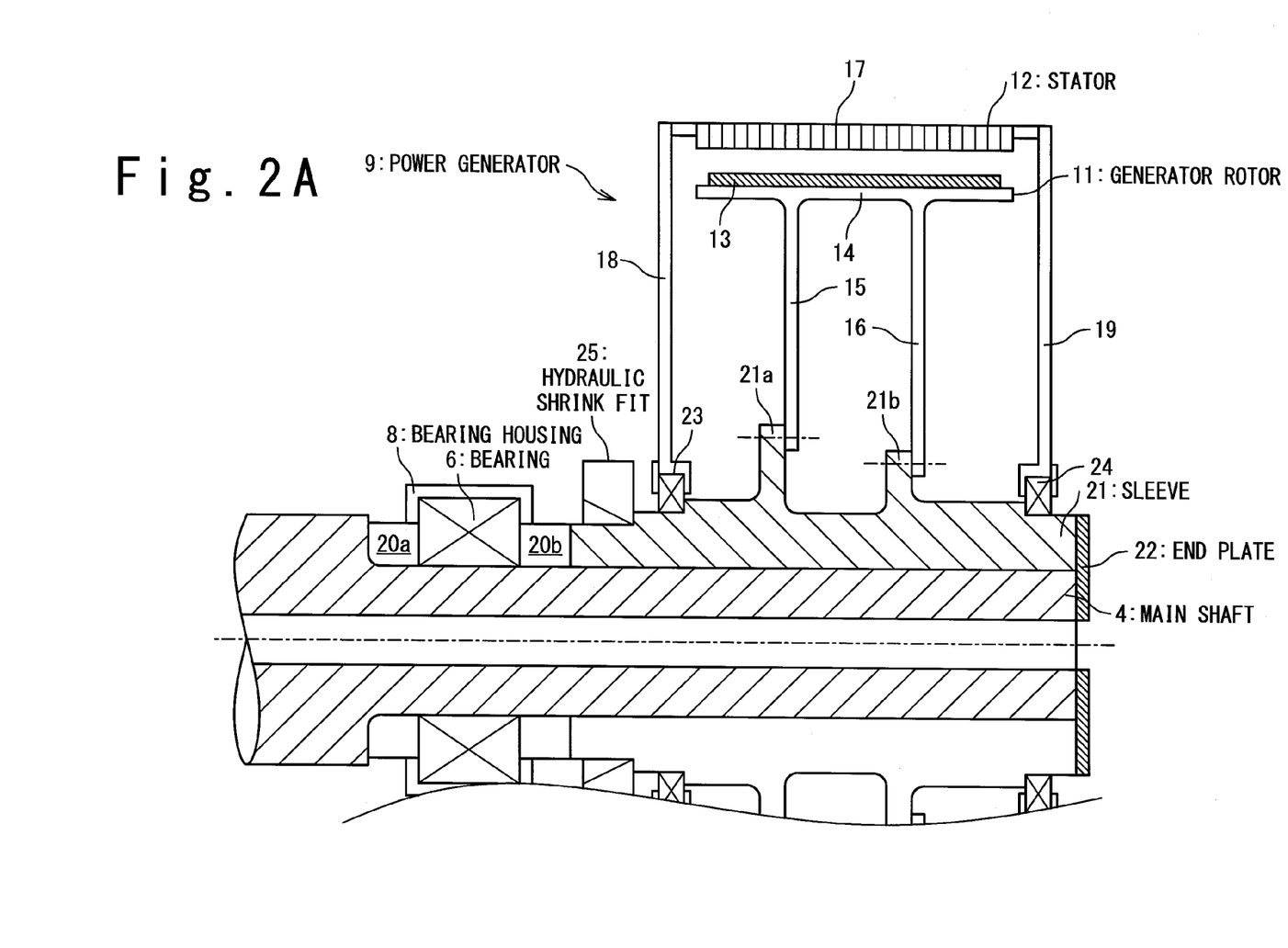
FIG. 2A is a cross-sectional view showing a configuration of a wind turbine generator in a first embodiment.

FIG. 2A is a cross-sectional view showing the structure of the wind turbine generator 1 in the vicinity of the power generator 9, especially showing details of the structure of the power generator 9 and the connection structure between the power generator 9 and the main shaft 4.

The power generator 9 includes a generator rotor 11 and a stator 12. The power generator 11 includes field magnets 13 (rotor magnetic poles), a back plate 14 supporting the field magnets 13, and rotor plates 15 and 16 supporting the back plate 14. The stator 12 includes stator windings (stator magnetic poles) 17 and stator plates 18 and 19 supporting the stator windings 17. The stator 12 is connected to the nacelle base plate 3 by a supporting mechanism not shown in the drawing, to be secured.

Bearing securing members 20a and 20b are used for securing the bearing 6 to the main shaft 4. In detail, the bearing securing rings 20a and 20b are inserted onto the main shaft 4, and the main shaft 6 is sandwiched by the bearing securing rings 20a and 20b to be secured to the main shaft 4.

Figure 2B:
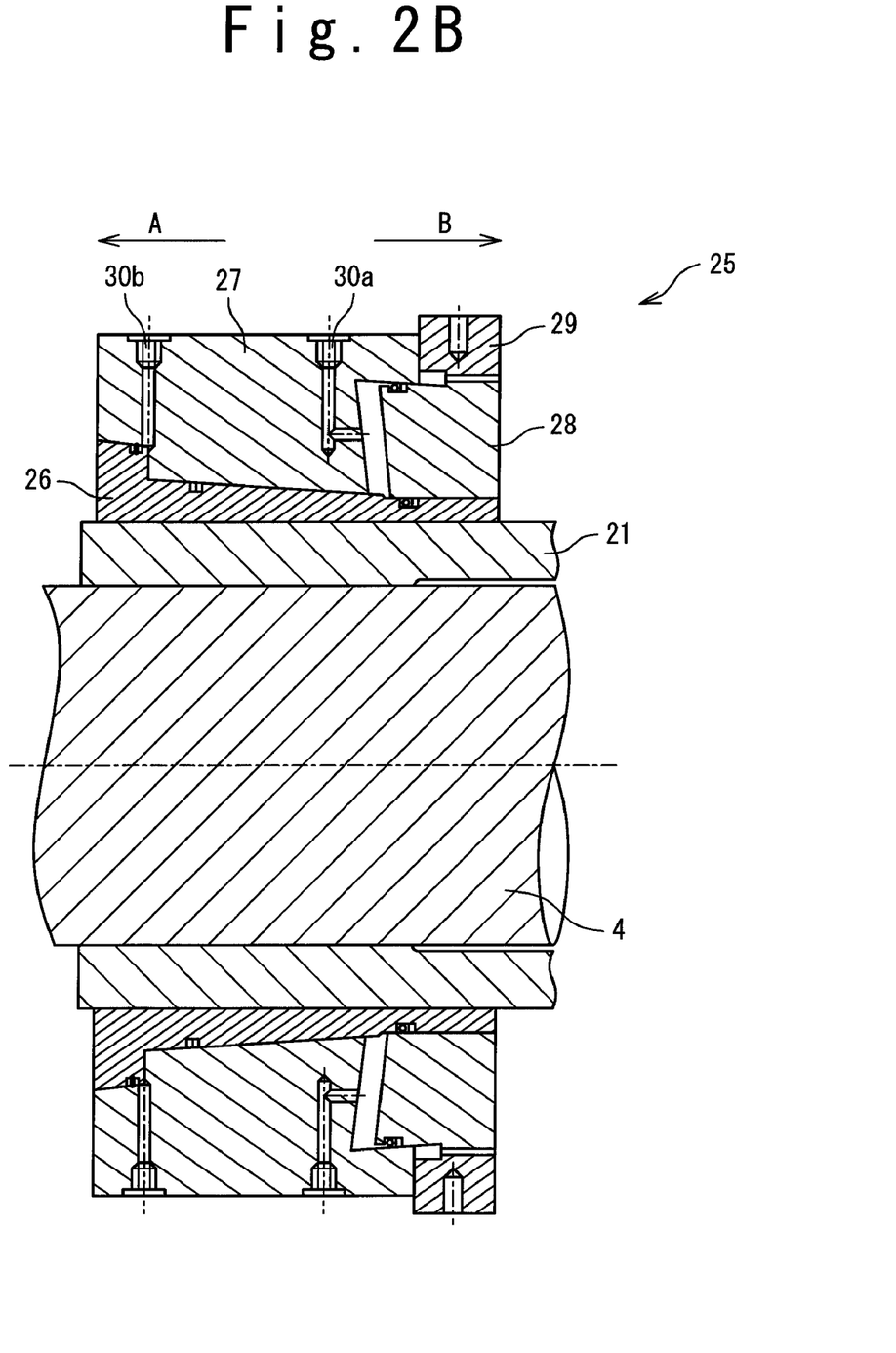
FIG. 2B is a cross-sectional view showing an example of a structure of a hydraulic shrink fit.

Meanwhile, a sleeve 21 and a hydraulic shrink fit 25 are used for securing the generator rotor 11 to the main shaft 4. In detail, the rotor plates 15 and 16 of the generator rotor 11 are secured to flanges 21a and 21b provided for the sleeve 21 by using bolts. Moreover, the sleeve 21 is tightened and secured to the main shaft 4 by the hydraulic shrink fit 25. FIG. 2B is a cross-sectional view showing an example of the structure of the hydraulic shrink fit 25. As shown in FIG. 2B, the hydraulic shrink fit 25 includes a secure ring 26, a movable ring 27, a support ring 28, and a ring nut 29. A tightening port 30a and a releasing port 30b are provided for the movable ring 27. When hydraulic fluid (typically, hydraulic oil) is supplied to the tightening port 30a, the movable ring 27 moves to the direction of the arrowed line A to be pressed to the secure ring 26. This reduces the inner diameter 26 of the secure ring (that is, the inner diameter of the hydraulic shrink fit 25) to tighten the sleeve 21 to the main shaft 41; the generator rotor 11 is secured to the main shaft 4 by tightening the sleeve 21 connected to the generation rotor 11 to the main shaft 4. As described below, it is important that the hydraulic shrink fit 25 is used for tightening the sleeve 21 to the main shaft 4 in this embodiment. When the hydraulic fluid is supplied to the releasing port 30b, on the other hand, the movable ring 27 moves to the direction of the arrowed line B and the tightening is released.

Referring back to FIG. 2A, an end plate 22 is additionally used for preventing displacement of the sleeve 21 in the axial direction (that is, the direction parallel to the central line of the main shaft 4; the same goes for the following). In detail, the end plate 22 is attached so as to stride the end of the sleeve 21 and the end of the main shaft 4, and the sleeve 21 is sandwiched by the bearing securing ring 20b and the end plate 22. In this manner, movement of the sleeve 21 in the axial direction is suppressed.

In addition, power generator bearings 23 and 24 are provided for the stator plates 18 and 19 of the stator 12, and the main shaft 4 and the sleeve 21 support the stator plates 18 and 19 with the power generator bearings 23 and 24. With the power generator bearings 23 and 24, the main shaft 4 and the sleeve 21 are rotatable with respect to the stator plates 18 and 19. This structure is effective in distributing the mechanical load caused by the weight of the power generator 9.

Figure 3A:
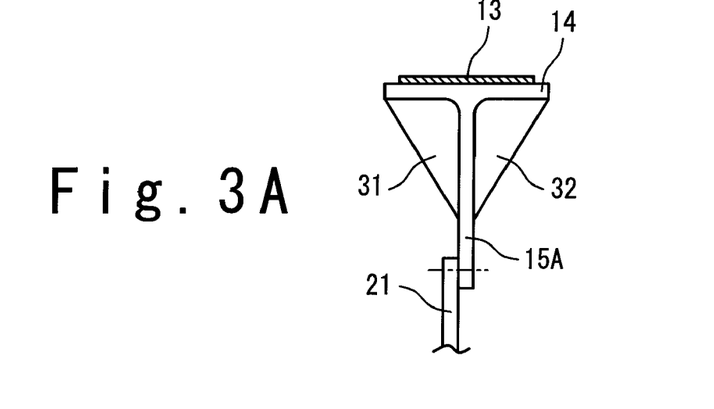
FIG. 3A is a cross-sectional view showing an example of a structure supporting field magnets and a back plate.
Figure 3B:
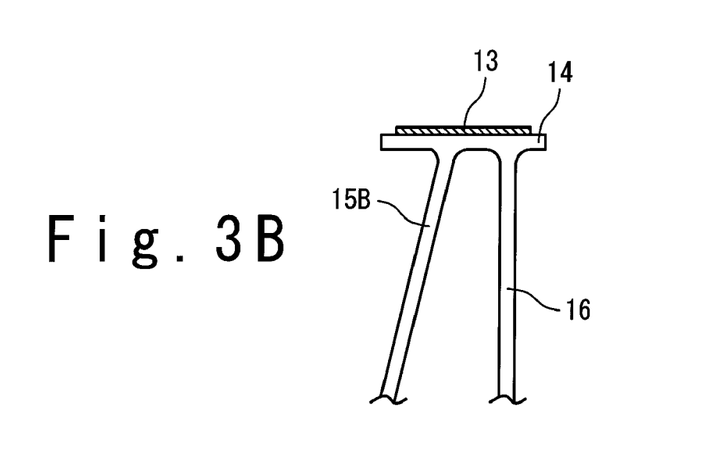
FIG. 3B is a cross-sectional view showing another example of the structure supporting the field magnets and the back plate.
Figure 3C:
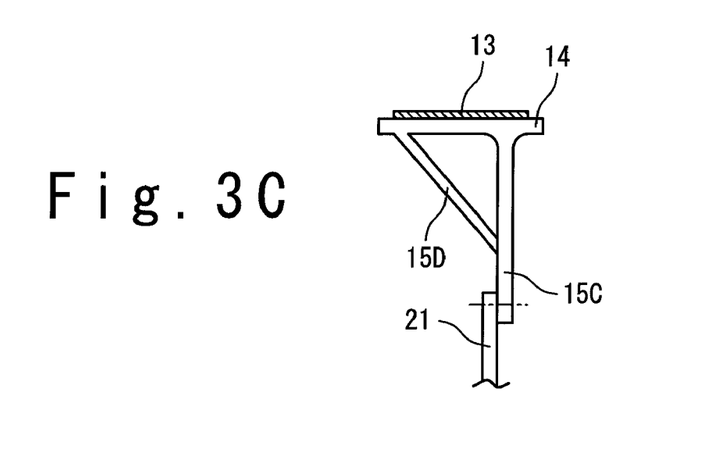
FIG. 3C is a cross-sectional view showing still another example of the structure supporting the field magnets and the back plate.

Although the rotor plates 15 and 16 are used as a supporting member for supporting the field magnets 13 and the back plate 14 in FIG. 2A, the structure for supporting the field magnets 13 and the back plate 14 may be variously modified. As shown in FIG. 3A, for example, a single rotor plate 15A and reinforcing ribs 31 and 32 connected to the back plate 14 and the rotor plate 15A may be used as a supporting member for supporting the field magnetic 13 and the back plate 14. In addition, as shown in FIG. 3B, a corn-shaped rotor plate 15B may be used. Moreover, as shown in FIG. 3C, a rotor plate 15C and a reinforcing arm 15D may be used, one end of the reinforcing arm 15D being connected to the back plate 14 and the other end being connected to the rotor plate 15C.

An advantage of the structure of the wind turbine generator 1 of this embodiment is that the distance between the bearing 6 and the power generator 9 is reduced by securing the sleeve 21 with the hydraulic shrink fit 25. The use of the hydraulic shrink fit 25, which is operated by the hydraulic fluid, eliminates the need of providing a working space used for the tightening of the hydraulic shrink fit 25 between the bearing 6 and the hydraulic shrink fit 25 (differently from a shrink fit using a bolt). This allows reducing the distance between the bearing 6 and the power generator 9. As described above, the reduction of the distance between the bearing 6 and the power generator 9 is effective in the reduction of the mechanical load and the reduction of the length of the main shaft. On this occasion, it is further effective for the reduction of the distance between the bearing 6 and the power generator 9 to use a hydraulic shrink fit 25 configured so that the port accepting the hydraulic fluid supplies the hydraulic fluid in the radius direction of the main shaft 4.

It should be noted that the hydraulic shrink fit 25 is positioned between the bearing 6 and the power generator 9 in the structure of FIG. 2A; however, the hydraulic shrink fit 25 may be also provided inside the power generator 9. The provision of the hydraulic shrink fit 25 inside the power generator 9 is preferable in that the distance between the bearing 6 and the power generator 9 can be further shortened.

Figure 4:
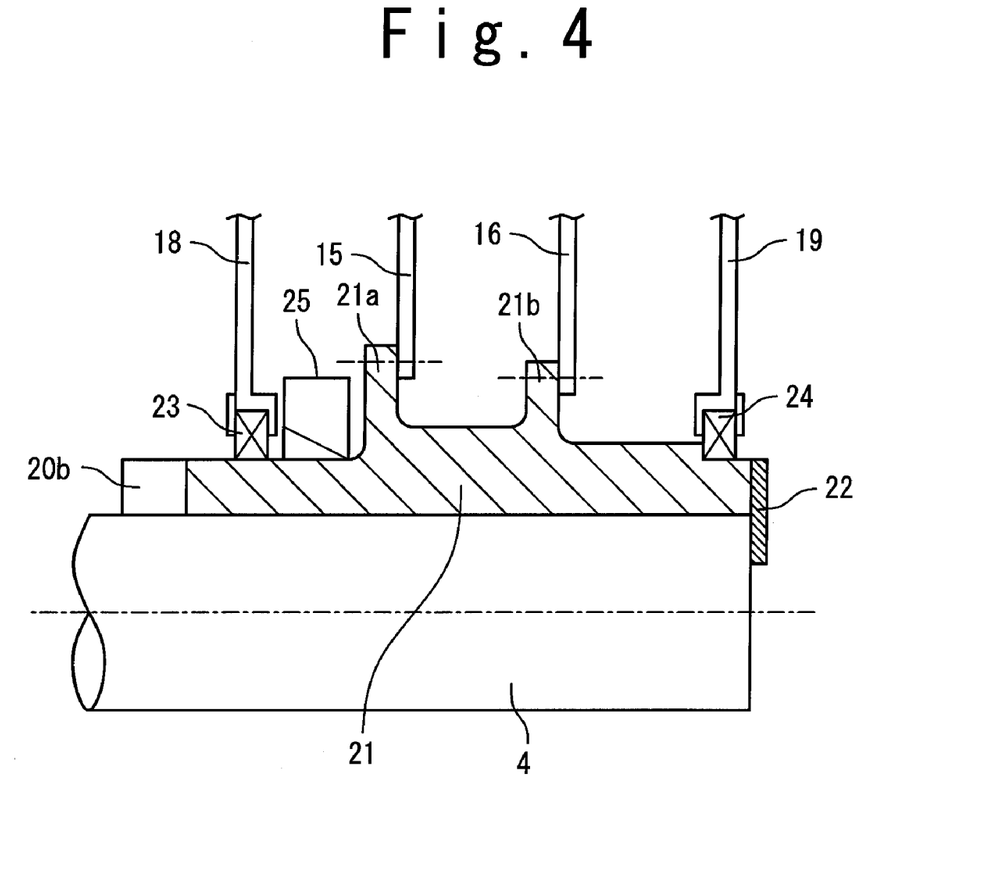
FIG. 4 is a cross-sectional view showing an example of a connection structure between a power generator and a sleeve in the first embodiment.
Figure 5:
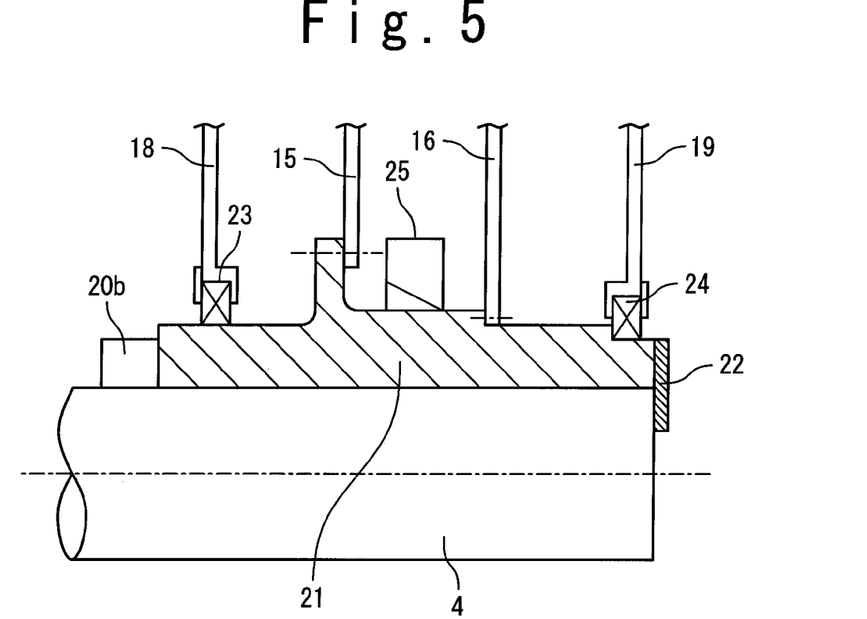
FIG. 5 is a cross-sectional view showing another example of the connection structure between the power generator and the sleeve in the first embodiment.
Figure 6:
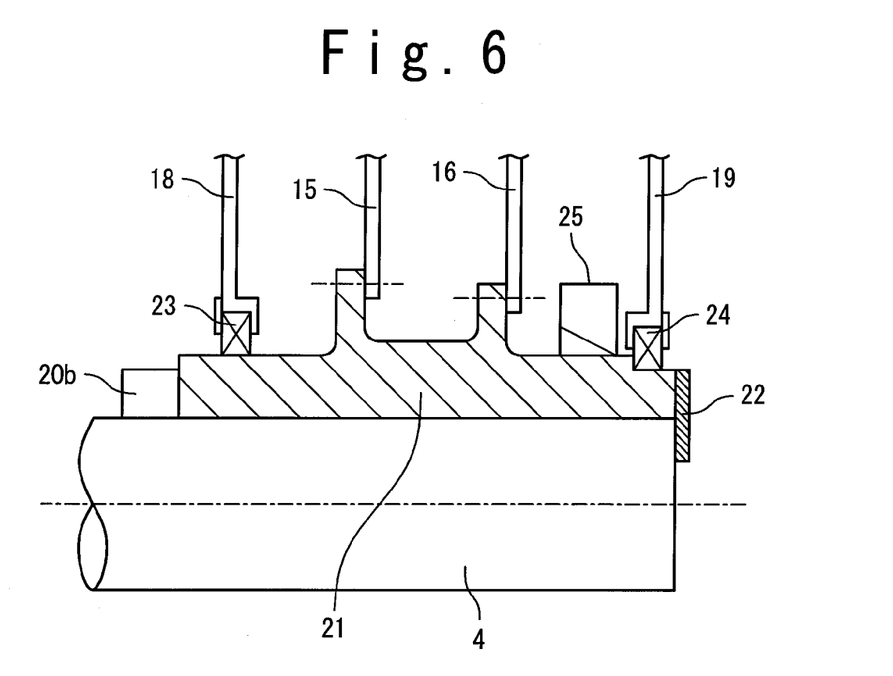
FIG. 6 is a cross-sectional view showing still another example of the connection structure between the power generator and the sleeve in the first embodiment.

As shown in FIG. 4, for example, the hydraulic shrink fit 25 may be provided between the stator plate 18, which is positioned near the bearing 6, and the rotor plate 15. In addition, as shown in FIG. 5, the hydraulic shrink fit 25 may be provided between the rotor plates 15 and 16. Moreover, as shown in FIG. 6, the hydraulic shrink fit 25 may be provided between the rotor plate 16 and the stator plate 19.

Figure 7:
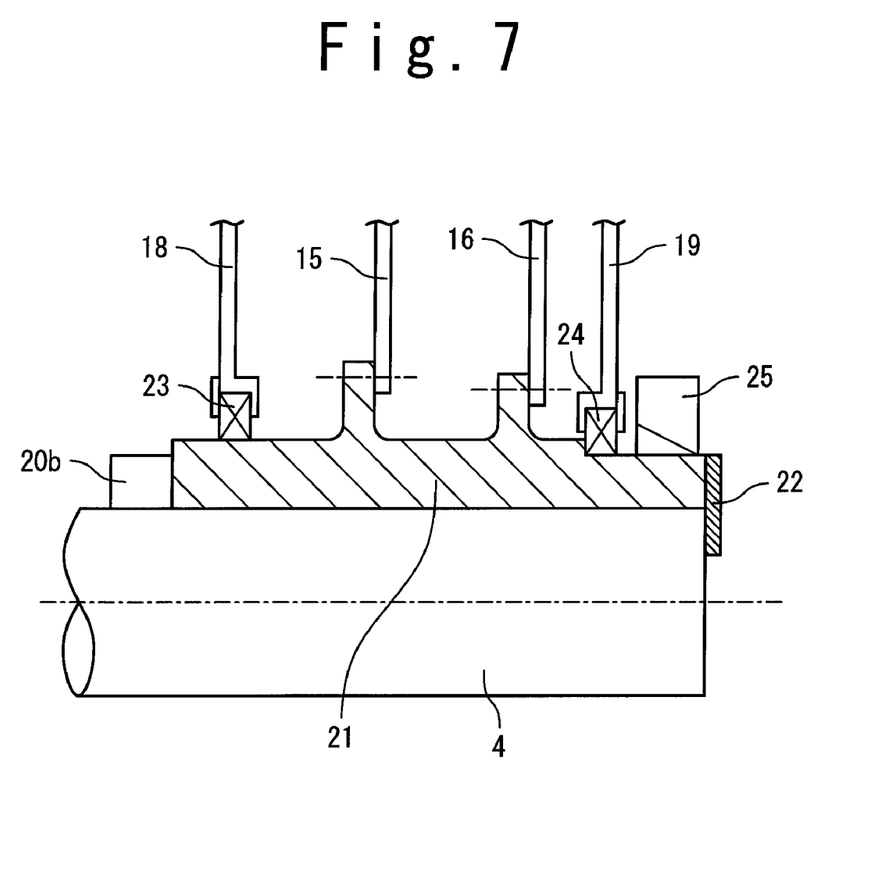
FIG. 7 is a cross-sectional view showing still another example of the connection structure between the power generator and the sleeve in the first embodiment.

In view of the reduction of the distance between the bearing 6 and the power generator 9, the hydraulic shrink fit 25 may be provided at a position between the power generator 9 and the end of the main shaft 4 as shown in FIG. 7.

Figure 8A:
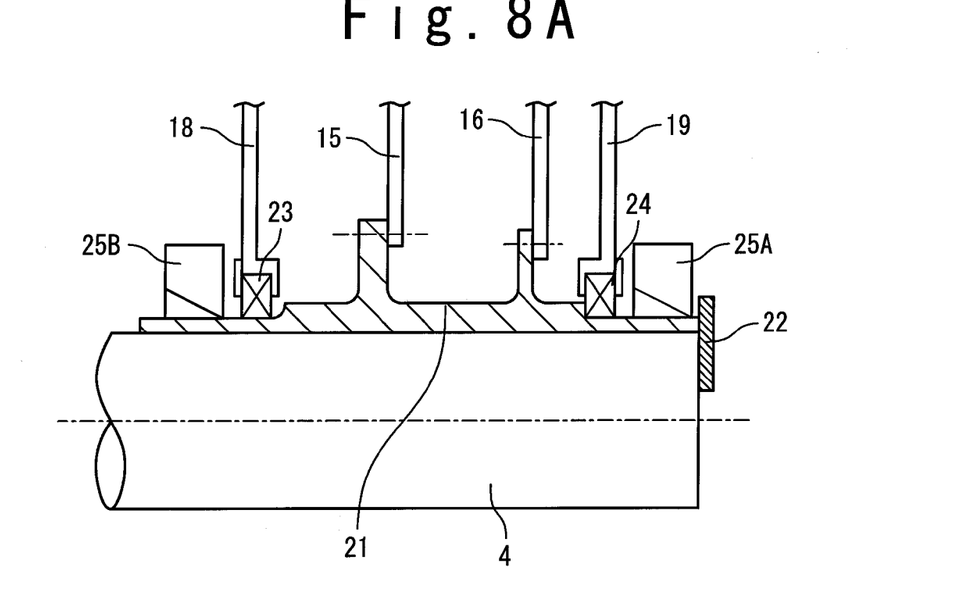
FIG. 8A is a cross-sectional view showing further another example of the connection structure between the power generator and the sleeve in the first embodiment.
Figure 8B:
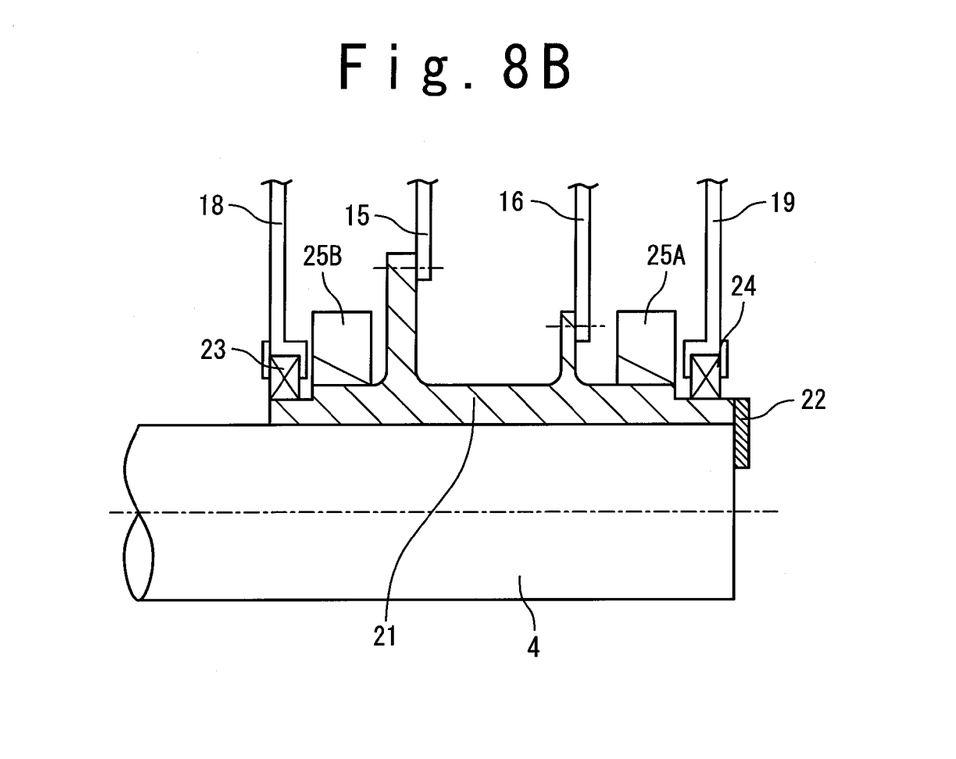
FIG. 8B is a cross-sectional view showing still another example of the connection structure between the power generator and the sleeve according to the first embodiment.

Also, as illustrated in FIGS. 8A and 8B, a plurality of hydraulic shrink fits may be used for tightening the sleeve 21 to the main shaft 4. In FIG. 8A, the hydraulic shrink fit 25A is provided at a position between the power generator 9 and the end of the main shaft 4, and the hydraulic shrink fit 25B is provided at a position between the power generator 9 and the bearing 6. On the other hand, both of two hydraulic shrink fits 25A and 25B are provided inside the power generator 9 in FIG. 8B. Specifically, the hydraulic shrink fit 25A is provided between the stator plate 19 and the rotor plate 16, and the hydraulic shrink fit 25B is provided between the stator plate 19 and the rotor plate 16.

When a hydraulic shrink fits 25 is provided inside the power generator 9, the operation to tighten the hydraulic shrink fit 25, including a supply of the hydraulic fluid to the hydraulic shrink fits 25, is required. If a foreign substance enters in the power generator 9 in performing the operation, damage of the power generator 9 may be caused by the foreign substance.

Figure 9:
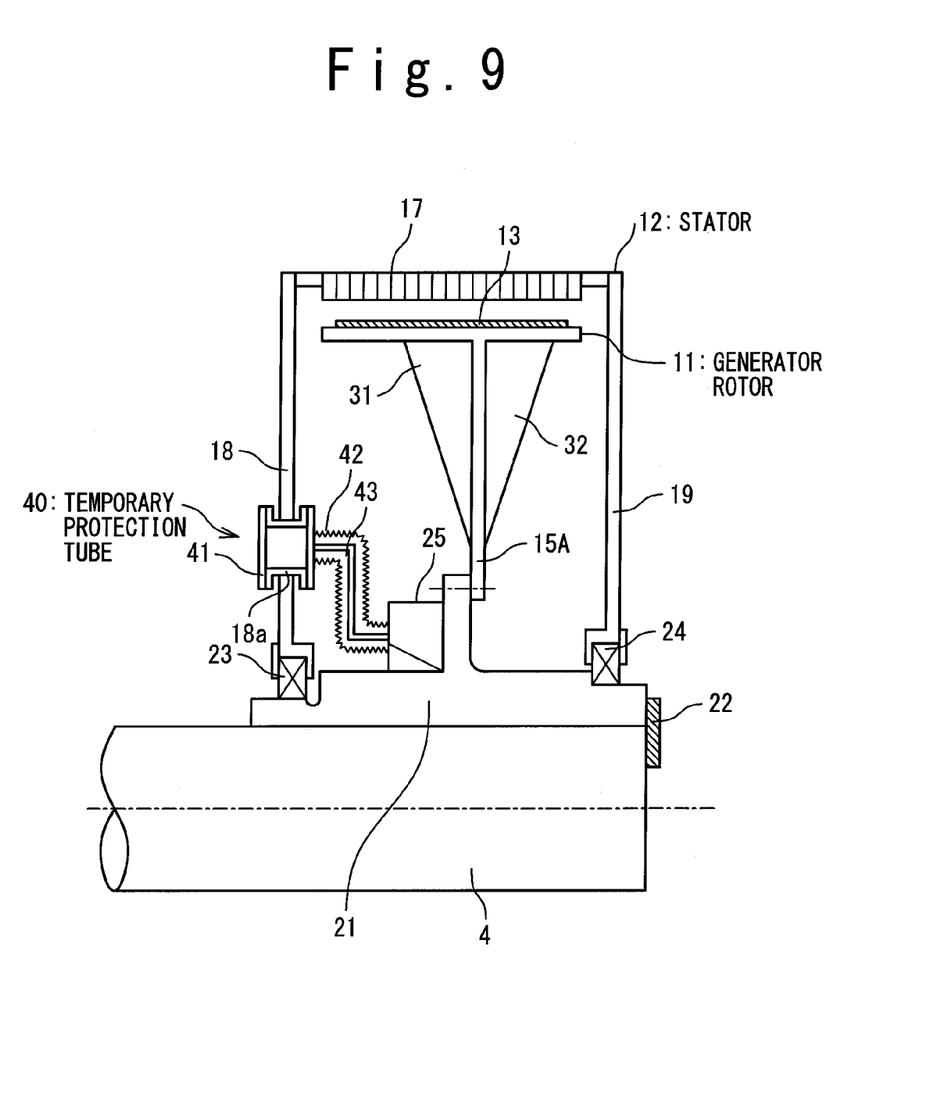
FIG. 9 is a schematic diagram showing a tightening method of the hydraulic shrink fit for preventing a foreign substance from entering inside the power generator.

In order to avoid the damage of the power generator 9 caused by the foreign substance, it is preferable to use a temporary protection tube 40 as illustrated in FIG. 9. An opening 18a is provided at a position in the vicinity of the port of the hydraulic shrink fit 25 through the stator plate 18, and the temporary protection tube 40 is inserted into the opening 18a. The temporary protection tube 40 is installed so that the port of the hydraulic shrink fit 25 is placed inside the cylinder. Performing the operation for tightening the hydraulic shrink fit 25 inside the temporary protection tube 40 allows avoiding the entering of the foreign substance.

More specifically, a protection pipe 41 and a flexible tube 42 are used as the temporary protection tube 40 in this embodiment. In one example, the operation for tightening the hydraulic shrink fit 25 is performed in the following procedure: At first, the protection pipe 41 is inserted into and secured to the opening 18a of the stator plate 18 under a state where one end of the flexible tube 42 is connected to the end of the protection pipe 41. On this occasion, the other end of the flexible tube 42 is connected in the vicinity of the port so as to surround the port of the hydraulic shrink fit 25. Moreover, a hydraulic pressure pipe 43 is inserted into the protection pipe 41 and the flexible tube 42, and the hydraulic pressure pipe 43 is connected to the port. Subsequently, the hydraulic fluid (typically, hydraulic oil) is supplied to the port through the hydraulic pressure pipe 43 and the hydraulic shrink fit 25 is tightened. This is followed by removing the protection pipe 41, the flexible tube 42, and the hydraulic pressure pipe 43 after the port is sealed. Finally, a lid is put on the opening 18a and then the operation is completed.

Although the generator rotor 11 having the structure of FIG. 3A is used in FIG. 9; it would be understood by a person in the art that various structures may be used as the generator rotor 11.

In the structure of this embodiment, the connection of the generator rotor 11 to the main shaft 4 is achieved by inserting the sleeve 21 onto the main shaft 4 after connecting the rotor plates 15 and 16 of the generator rotor 11 to the sleeve 21. On this occasion, it is desired that the clearance between the main shaft 4 and the sleeve 21 is wide in performing the operation for inserting the sleeve 21 into the main shaft 4, since the generator rotor 11 and the sleeve 21 are considerably heavy. If the clearance between the main shaft 4 and the sleeve 21 is 0.5 mm or more, for example, this make it easy to insert the sleeve 21 onto the main shaft 4.

To allow an increase in the clearance between the main shaft 4 and the sleeve 21, it is preferable that the sleeve 21 is configured so that the rigidity of a portion abutting on the hydraulic shrink fit 25 of the sleeve 21 is lower than that of other portions. For this purpose, it is preferable that a slit is formed in the portion abutting on the hydraulic shrink fit 25 of the sleeve 21.

Figure 10A:
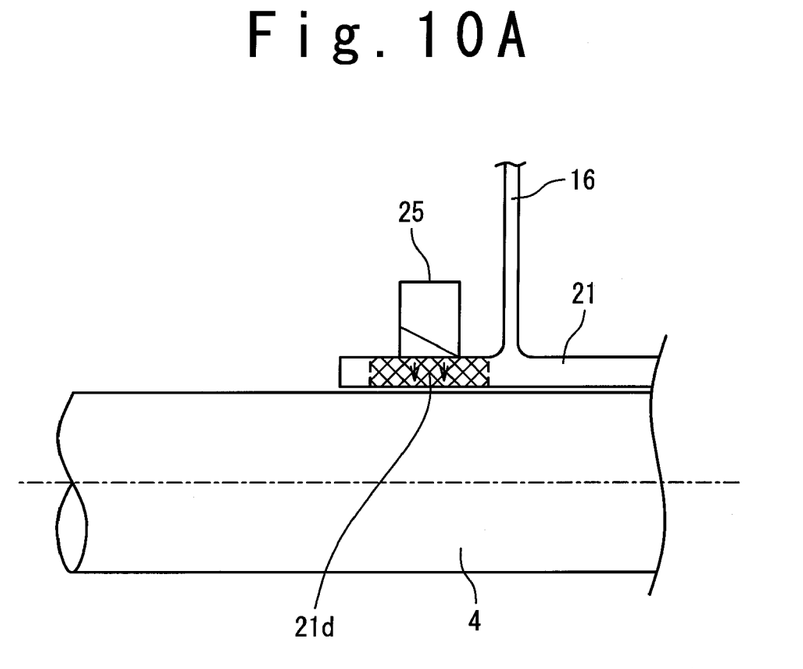
FIG. 10A is a cross-sectional view showing further another example of the connection structure between the power generator and the sleeve in the first embodiment.
Figure 10B:
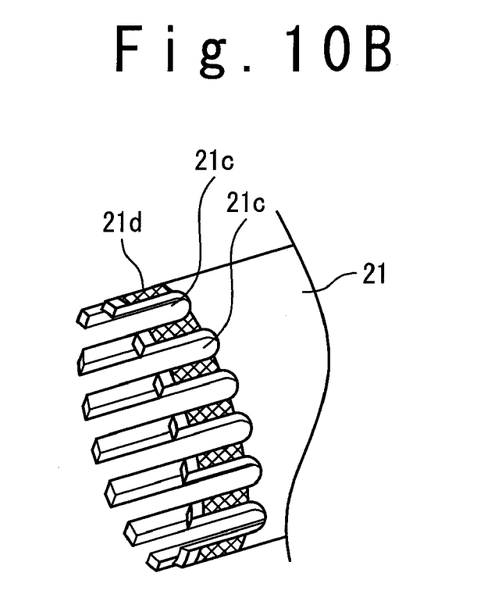
FIG. 10B is a perspective view showing an example of the structure of the sleeve in the first embodiment.

When the hydraulic shrink fit 25 is tightened in the end of the sleeve 21 as shown in FIG. 10A, for example, it is preferable that a plurality of the slits 21c are provided at the end of the sleeve 21 as shown in FIG. 10B. It should be noted that the reference number 21d denotes the portion to which the hydraulic shrink fit 25 is abutted in FIGS. 10A and 10B. In the configuration of FIG. 10A, the slits 21c are formed to be long in the axial direction of the main shaft 4, and are arranged in the circumferential direction of the main shaft 4.

Figure 11A:
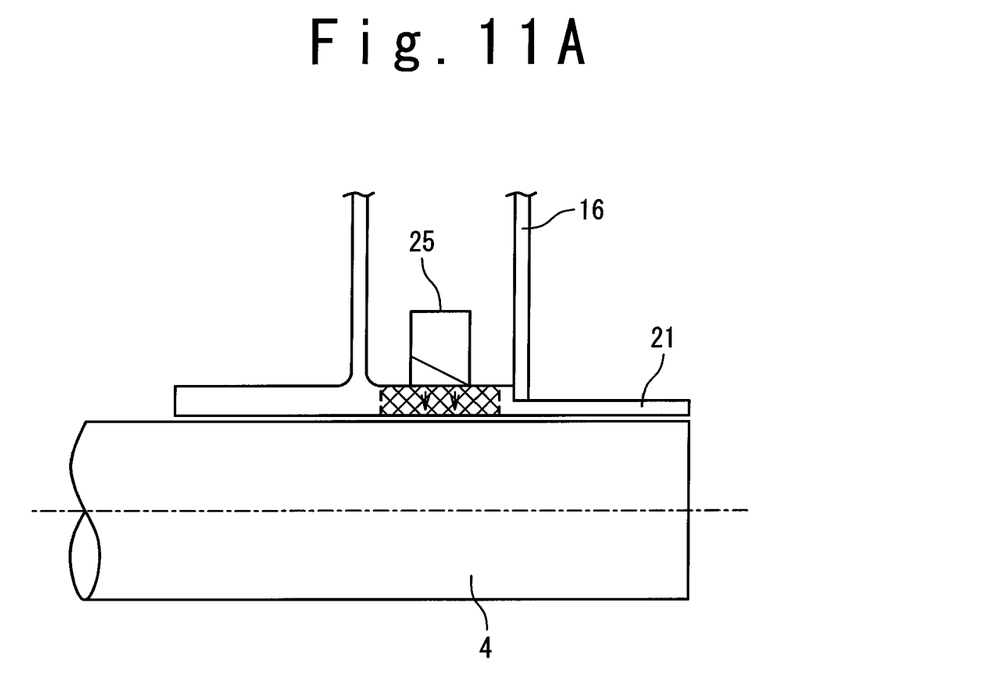
FIG. 11A is a cross-sectional view showing still another example of the connection structure between the power generator and the sleeve in the first embodiment.
Figure 11B:
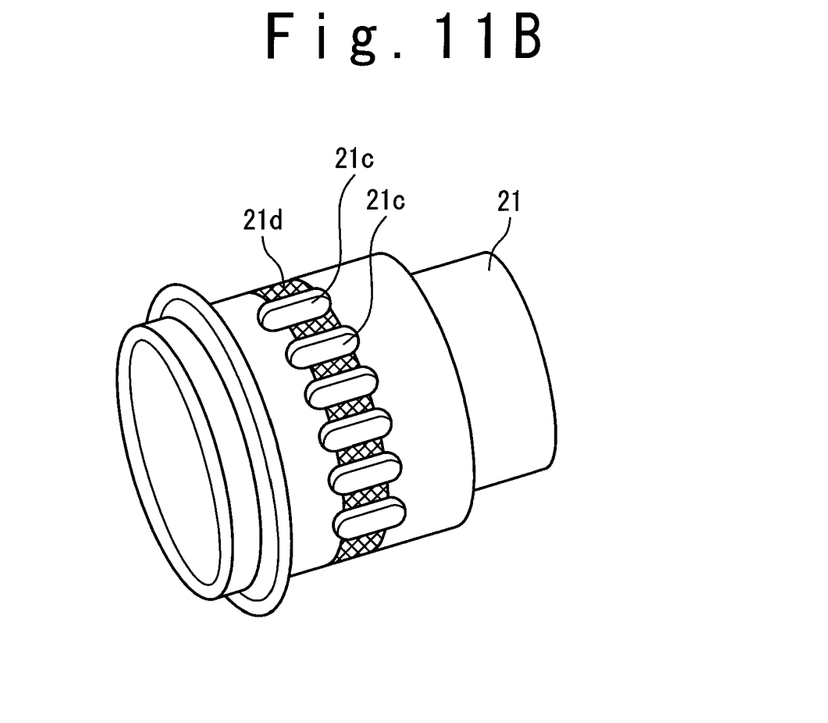
FIG. 11B is a perspective view showing another example of the structure of the sleeve in the first embodiment.

In addition, when the hydraulic shrink fit 25 is tightened in a middle portion of the sleeve 21 as shown in FIG. 11A, it is preferable that a plurality of the slits 21c are provided in the middle of the sleeve 21 as shown in FIG. 11B. In the configuration of FIG. 11B, the slits 21c are formed to be the long in the axial direction of the main shaft 4, and are arranged in line along a circular direction of the main shaft 4.

Figure 11C:
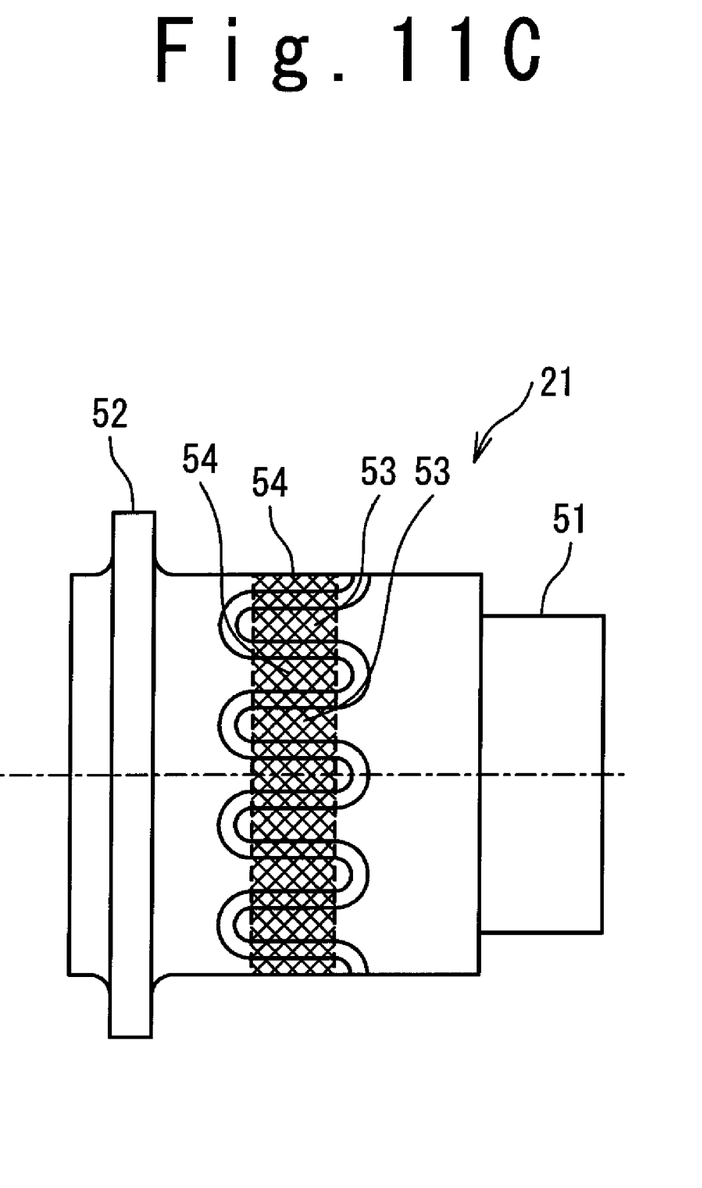
FIG. 11C is a perspective view showing another example of the structure of the sleeve according to the first embodiment.

Instead of forming the slits, the rigidity of the portion abutting on the hydraulic shrink fit 25 may be reduced by dividing the sleeve 21 at a position abutting on the hydraulic shrink fit 25. FIG. 11C is a side view showing an example of the structure of a sleeve 21 of a block construction. The sleeve 21 includes two sleeve members 51 and 52 arranged in the axial direction of the main shaft 4. A plurality of protuberance portions 53 arranged in the circumferential direction of the main shaft 4 and protuberating in the axial direction of the main shaft 4 are provided at the end of the sleeve member 51, and a plurality of protuberance portions 54 arranged in the circumferential direction and protuberating in the axial direction are provided at the end of the sleeve member 52. The sleeve members 51 and 52 are engaged by the protuberance portions 53 and 54. That is, each of the protuberance portions 53 of the sleeve member 51 is inserted between two of the protuberance portions 54 of the sleeve member 52. The hydraulic shrink fit 25 is tightened to the portion at which the protuberance portions 53 and 54 are engaged. Such the structure allows reducing the rigidity of the portion abutting on the hydraulic shrink fit 25 of the sleeve 21.

Second Embodiment

Figure 12:
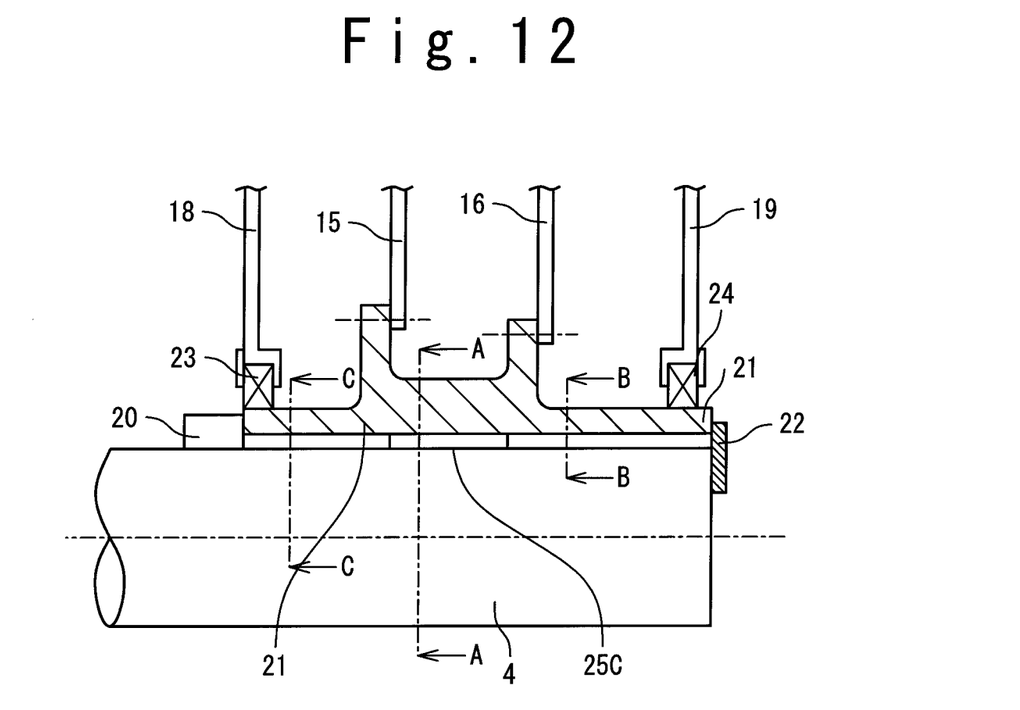
FIG. 12 is a cross-sectional view showing an example of a connection structure between a power generator and a sleeve in a second embodiment of the present invention.

FIG. 12 is a cross-sectional view showing the structure of the wind turbine generator 1 in a second embodiment of the present invention, and especially showing the connection structure between the generator rotor 11 and the main shaft 4. In the second embodiment, a cylindrical hydraulic shrink fit 25C is provided between the main shaft 24 and the sleeve 21. The hydraulic shrink fit 25C is formed so as to increase the outer diameter through supply of hydraulic fluid (typically hydraulic oil). When the outer diameter of the hydraulic shrink fit 25C is increased, the frictional force acting between the main shaft 4 and the hydraulic shrink fit 25C and the frictional force acting between the hydraulic shrink fit 25C and the sleeve 21 are increased, and accordingly the main shaft 4 and the sleeve 21 are connected. The structure where the hydraulic shrink fit 25C is provided between the main shaft 4 and the sleeve 21 as shown in FIG. 12 also allow reducing the distance between the power generator 9 and the bearing 6, since the working space is not required between the power generator 9 and the bearing 6.

One problem of the structure where the hydraulic shrink fit 25C is provided between the main shaft 4 and the sleeve 21 is that an excessive mechanical load may act to the power generator bearings 23 and 24 when the outer diameter of the hydraulic shrink fit 25C is increase. To address this problem, it is preferable that the hydraulic shrink fit 25C is installed at such a position that the hydraulic shrink fit 25C is not opposed to the power generator bearings 23 and 24 in the radius direction of the main shaft 4. This allows reducing the stress directly acting to the power generator bearings 23 and 24, when the outer diameter of the hydraulic shrink fit 25C is increased.

In addition, it is preferable that the portion of the sleeve 21 between the positions where the power generator bearings 23 and 24 are provided and the position abutting on the hydraulic shrink fit 25C is configured so as to absorb the distortion caused by the tightening of the hydraulic shrink fit 25C. In one embodiment, for example, the sleeve 21 is configured so that the thicknesses of the sleeve 21 in the cross-sections B and C within the portions of the sleeve 21 at which the power generator bearings 23 and 24 are provided may be thinner than the thickness of the sleeve 21 in the cross-section A within the portion abutting on the hydraulic shrink fit 25C of the sleeve 21, as shown in FIG. 12. Such the structure suppresses the deformation of the sleeve 21 against the increase of the outer diameter of the hydraulic shrink fit 25C to increase the frictional force in the cross-section A while allowing the deformation of the sleeve 21 in the cross-sections B and C to thereby suppresses the mechanical load acting to the power generator bearings 23 and 24.

Figure 13:
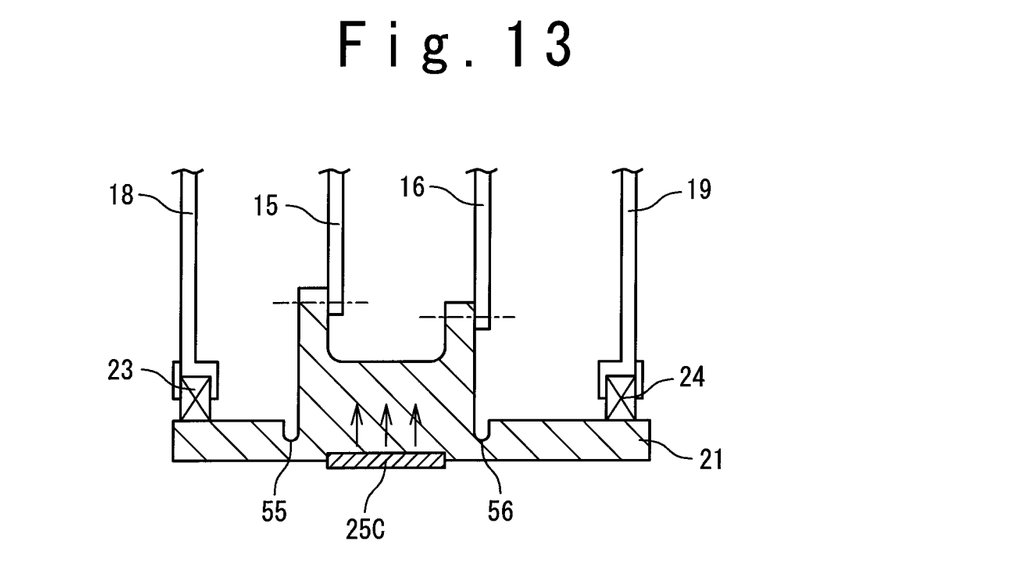
FIG. 13 is a cross-sectional view showing another example of the connection structure between the power generator and the sleeve in the second embodiment.

Furthermore, as shown in FIG. 13, notches 55 and 56 may be provided at positions between the portion abutting on the hydraulic shrink fit 25C of the sleeve 21 and the power generator bearings 23 and 24. By allowing the deformation of the sleeve 21 in the notches 55 and 56, the mechanical load acting to the power generator bearings 23 and 24 can be suppressed.

The invention claimed is:

1. A wind turbine generator, comprising:
a main shaft supporting a wind turbine rotor;
a main bearing rotatably supporting said main shaft;
a generator including a generator rotor and a stator;
a sleeve connected to said generator rotor and having a cylindrical inner face into which said main shaft is inserted; and a
hydraulic shrink fit provided outside said sleeve and tightening said sleeve to connect to said main shaft,
wherein said hydraulic shrink fit has an inner diameter, which is constructed configured to be reduced reduce through a supply of hydraulic fluid to secure said sleeve to the main shaft and, wherein said hydraulic shrink fit is provided inside of said generator.

2. A wind turbine generator, comprising:
a main shaft supporting a wind turbine rotor;
a main bearing rotatably supporting said main shaft;
a generator including a generator rotor and a stator;
a sleeve connected to said generator rotor and inserted onto said main shaft;
a hydraulic shrink fit provided outside said sleeve and tightening said sleeve to connect to said main shaft; and
first and second generator bearings,
wherein
said hydraulic shrink fit has an inner diameter and is adapted to reduce the inner diameter through a supply of hydraulic fluid to secure said sleeve to the main shaft,
said hydraulic shrink fit is provided inside of said generator,
said stator includes:
    stator magnetic poles arranged in the circumferential direction of said main shaft; and
    first and second stator plates supporting said stator magnetic poles and arranged in the axial direction of the main shaft,
said first stator plate and said main shaft are rotatable to each other via said first generator bearing,
said second stator plate and said main shaft are rotatable to each other via said second generator bearing,
said generator rotor includes:
    rotor magnetic poles arranged in the circumferential direction of said main shaft; and
    a rotor supporting member supporting said rotor magnetic poles and arranged between said first stator plate and said second stator plate, and
said hydraulic shrink fit is provided between said rotor supporting member and said first stator plate.

3. The wind turbine generator according to claim 2, wherein said first stator plate is provided with an opening for supplying said hydraulic fluid to said hydraulic shrink fit at a position corresponding to said hydraulic shrink fit.

4. A method of assembling the wind turbine generator according to claim 3, comprising:
a step of inserting a temporary protection tube into said opening provided through said first stator plate so that a port of said hydraulic shrink fit is positioned inside said temporary protection tube;
a step of connecting a hydraulic pressure pipe to said port inside said temporary protection tube; and
a step of supplying hydraulic fluid to said hydraulic shrink fit through said hydraulic pressure pipe to tighten said sleeve to said main shaft by said hydraulic shrink fit.

5. A wind turbine generator, comprising:
a main shaft supporting a wind turbine rotor;
a main bearing rotatably supporting said main shaft;
a generator including a generator rotor and a stator;
a sleeve connected to said generator rotor and inserted onto said main shaft; and
a hydraulic shrink fit provided outside said sleeve and tightening said sleeve to connect to said main shaft,
wherein
said hydraulic shrink fit has an inner diameter and is adapted to reduce the inner diameter through a supply of hydraulic fluid to secure said sleeve to the main shaft, and
a slit is provided for an abutting portion of said sleeve, the abutting portion abutting on said hydraulic shrink fit.

6. A wind turbine generator, comprising:
a main shaft supporting a wind turbine rotor;
a main bearing rotatably supporting said main shaft;
a generator including a generator rotor and a stator;
a sleeve connected to said generator rotor and inserted onto said main shaft; and
a hydraulic shrink fit provided outside said sleeve and tightening said sleeve to connect to said main shaft,
wherein
said hydraulic shrink fit has an inner diameter and is adapted to reduce the inner diameter through a supply of hydraulic fluid to secure said sleeve to the main shaft,
said sleeve includes first and second sleeve members arranged in the axial direction of said main shaft,
a plurality of first protuberance portions arranged in the circumferential direction of said main shaft and protuberating in the axial direction of said main shaft are provided at an end of said first sleeve member,
a plurality of second protuberance portions arranged in the circumferential direction of said main shaft and protuberating in the axial direction of said main shaft are provided to an end of the second sleeve member,
each of said plurality of first protuberance portions is inserted between two of said plurality of second protuberance portions, and
said hydraulic shrink fit is provided so as to abut said first protuberance portions and the second protuberance portions.

7. A wind turbine generator, comprising:
a main shaft for supporting a wind turbine rotor;
a main bearing for rotatably supporting said main shaft;
a generator having a generator rotor and a stator;
a sleeve connected to said generator rotor and inserted onto the main shaft; and
a hydraulic shrink fit provided between said sleeve and said main shaft,
wherein
said hydraulic shrink fit further includes an outer diameter that is configured to be increased through a supply of hydraulic fluid, and
said hydraulic shrink fit is configured to press said sleeve in an outward radial direction of said main shaft with said hydraulic fluid kept in said hydraulic shrink fit.

8. The wind turbine generator according to claim 7, further comprising first and second generator bearings,
wherein said stator includes:

stator magnetic poles arranged in the circumferential direction of said main shaft; and first and second stator plates for supporting said stator magnetic poles, said stator plates being arranged in the axial direction of said main shaft, said first stator plate and said main shaft are rotatable to each other via said first generator bearing, said second stator plate and the main shaft are rotatable to each other via said second generator bearing, and said hydraulic shrink fit is positioned between the first and second generator bearings in an axial direction of the main shaft.

9. The wind turbine generator according to claim 8, wherein a portion of said sleeve between positions where said first and second generator bearings and a position abutting on said hydraulic shrink fit is configured so as to absorb distortion caused by tightening of said hydraulic shrink fit.

* * * * *